(12) United States Patent
Barner et al.

(10) Patent No.: US 11,084,694 B2
(45) Date of Patent: Aug. 10, 2021

(54) JACKING TOOL AND SEMICONDUCTOR PROCESS APPARATUS HAVING THE SAME

(71) Applicant: Samsung Electronics Co., Ltd., Suwon-si (KR)

(72) Inventors: Christopher W Barner, Hutto, TX (US); Scott P Lewis, Austin, TX (US)

(73) Assignee: SAMSUNG ELECTRONICS CO., LTD.

( * ) Notice: Subject to any disclaimer, the term of this patent is extended or adjusted under 35 U.S.C. 154(b) by 379 days.

(21) Appl. No.: 15/992,120

(22) Filed: May 29, 2018

(65) Prior Publication Data
US 2019/0300345 A1 Oct. 3, 2019

Related U.S. Application Data

(60) Provisional application No. 62/648,929, filed on Mar. 27, 2018.

(51) Int. Cl.
| | |
|---|---|
| *B66F 3/12* | (2006.01) |
| *H01L 21/67* | (2006.01) |
| *C23C 16/455* | (2006.01) |
| *H01J 37/32* | (2006.01) |

(52) U.S. Cl.
CPC .......... *B66F 3/12* (2013.01); *C23C 16/45565* (2013.01); *H01J 37/3244* (2013.01); *H01L 21/67126* (2013.01)

(58) Field of Classification Search
CPC ...... B66F 7/00; B66F 7/10; B66F 7/12; B66F 7/14; B66F 3/10; B66F 3/08; B66F 3/46; H01L 21/687; H01L 21/68714; H01L 21/68742; H01L 21/68764; H01L 21/68785
See application file for complete search history.

(56) References Cited

U.S. PATENT DOCUMENTS

| | | | |
|---|---|---|---|
| 4,015,824 A * | 4/1977 | Profet | B66F 3/18 254/89 R |
| 7,661,386 B2 | 2/2010 | Kasai et al. | |
| 9,441,296 B2 | 9/2016 | Sabri et al. | |
| 2007/0131168 A1 | 6/2007 | Gomi et al. | |
| 2008/0134814 A1* | 6/2008 | Kim | H01L 21/68778 74/89.22 |
| 2018/0033674 A1 | 2/2018 | Jeong et al. | |
| 2019/0284822 A1* | 9/2019 | Hayes | B62B 3/06 |

* cited by examiner

*Primary Examiner* — Tyrone V Hall, Jr.
*Assistant Examiner* — Abbie E Quann
(74) *Attorney, Agent, or Firm* — Renaissance IP Law Group LLP

(57) ABSTRACT

A jacking tool includes a bar, a first jack and a second jack. The bar extends in a first direction and has a first connection region and a second connection. The first jack is movably attached to the first connection region of the bar. The second jack is movably attached to the second connection region of the bar. The first jack includes a foot, a first guiding rod and a second guiding rod spaced apart from each other in a second direction crossing the first direction, a rod disposed between the first and second guiding rods with a thread section that is movably attached to the bar, a knob attached to one end of the rod and a toggle attached to an opposite end of the rod that is proximate to the foot in the third direction.

17 Claims, 5 Drawing Sheets

US 11,084,694 B2

JACKING TOOL AND SEMICONDUCTOR PROCESS APPARATUS HAVING THE SAME

CROSS-REFERENCE TO RELATED APPLICATION

This application claims the priority of U.S. Provisional Application No. 62/648,929 filed on Mar. 27, 2018, the disclosure of which is incorporated herein by reference in its entirety.

TECHNICAL FIELD

The present inventive concept relates to a jacking tool and a semiconductor process apparatus having the same.

DISCUSSION OF RELATED ART

Wafers to be processed in semiconductor fabrication apparatuses are getting larger in size for higher throughput of a unit process, and it is difficult to perform a maintenance operation on the apparatuses due to their parts getting bigger and heavier. Maintenance of the apparatuses entails disassembly of various parts which requires separating of one part from another. Such separating may be performed by using robotic arms including gas springs and pneumatic actuators. The robotic arms are expensive and need extra maintenance for the mechanism of the robotic arms. In an affordable manner, maintenance engineers may use a pryer or a screw driver to separate one part (e.g., a heavy top plate of a process chamber) from another (e.g., a showerhead). Separating of the top plate from the showerhead may require two screwdrivers wedged between them, and they are pried apart using the pryer, which may cause damage on sealing surfaces on the showerhead or injury to the maintenance engineer.

SUMMARY

According to an exemplary embodiment of the present inventive concept, a jacking tool includes a bar, a first jack and a second jack. The bar extends in a first direction and has a first connection region proximate to one end of the bar and a second connection region proximate to another end of the bar. The first jack is movably attached to the first connection region of the bar. The second jack is movably attached to the second connection region of the bar. The first jack includes a foot, a first guiding rod and a second guiding rod spaced apart from each other in a second direction crossing the first direction, the first guiding rod having one end attached to the foot and penetrating the bar in a third direction and the second guiding rod having one end attached to the foot and penetrating the bar in the third direction, a rod disposed between the first guiding rod and the second guiding rod, the rod having a thread section that is movably attached to the bar, a knob attached to one end of the rod distal to the foot in the third direction and a toggle attached to an opposite end of the rod that is proximate to the foot in the third direction. The toggle is disposed between the bar and the foot.

According to an exemplary embodiment of the present inventive concept, a semiconductor fabrication apparatus having a jacking tool includes a frame, a showerhead accommodated with the frame and configured to distribute a gas into a chamber, a top plate disposed on the showerhead, an O-ring interposed between the showerhead and the top plate and a jacking tool attached to the top plate. The jacking tool includes a bar, a first jack and a second jack. The bar extends in a first direction and has a first connection region proximate to one end of the bar and a second connection region proximate to another end of the bar. The bar is attached to the top plate. The first jack is movably attached to the first connection region of the bar and is in contact with the frame. The second jack is movably attached to the second connection region of the bar and is in contact with the frame.

According to an exemplary embodiment of the present inventive concept, a jacking tool includes a bar extending in a first direction and a first jack movably attached to the bar. The first jack includes a foot, a first guiding rod and a second guiding rod spaced apart from each other in a second direction crossing the first direction, the first guiding rod having one end attached to the foot and penetrating the bar in a third direction and the second guiding rod having one end attached to the foot and penetrating the bar in the third direction, a rod disposed between the first guiding rod and the second guiding rod, the rod having a thread section that is movably attached to the bar, a knob attached to one end of the rod distal to the foot in the third direction and a toggle attached to an opposite end of the rod that is proximate to the foot in the third direction. The toggle is disposed between the bar and the foot.

BRIEF DESCRIPTION OF DRAWINGS

These and other features of the present inventive concept will become more apparent by describing in detail exemplary embodiments thereof with reference to the accompanying drawings of which.

Figure 1:
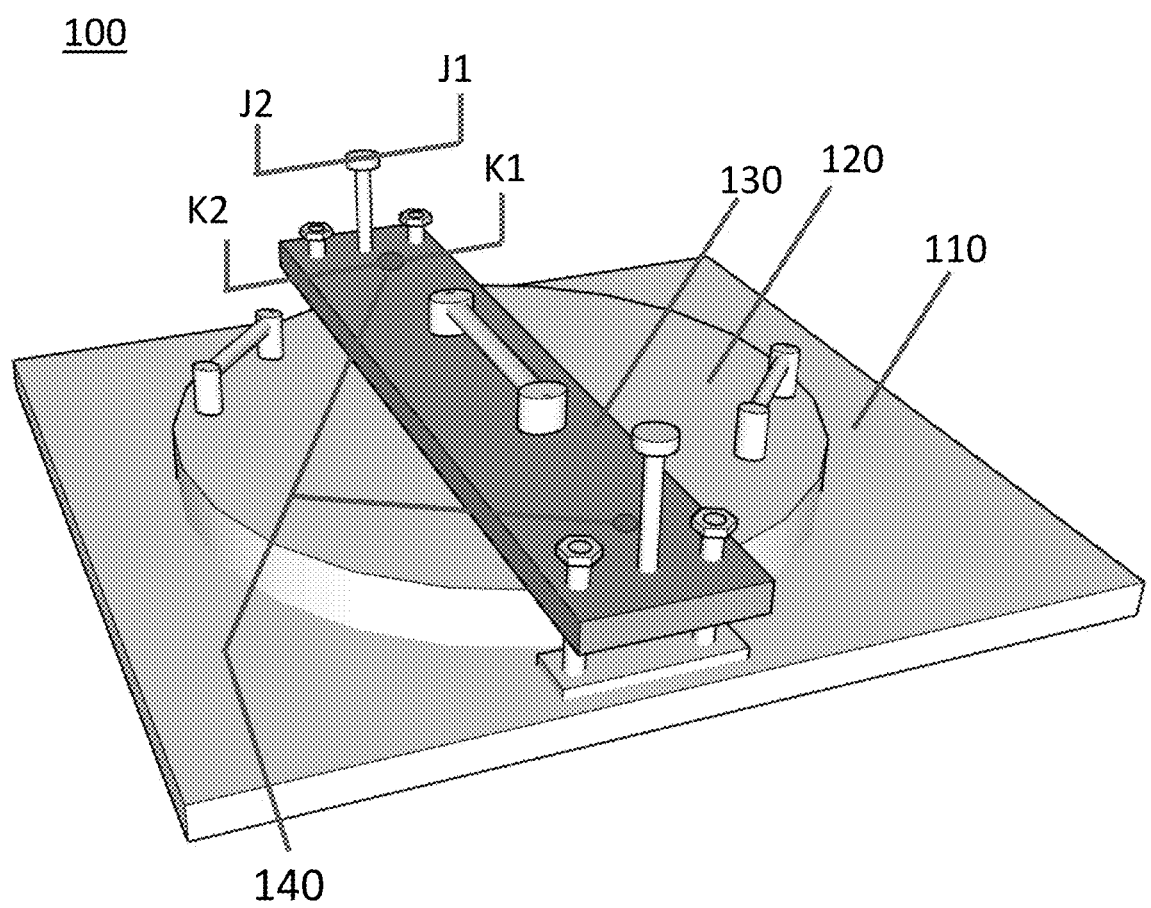
FIG. 1 shows a semiconductor fabrication system with a jacking tool attached thereto according to an exemplary embodiment of the present inventive concept.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DETAILED DESCRIPTION OF EXEMPLARY EMBODIMENTS

Exemplary embodiments of the present inventive concept will be described below in detail with reference to the accompanying drawings. However, the inventive concept may be embodied in different forms and should not be construed as limited to the embodiments set forth herein.

Figure 2:
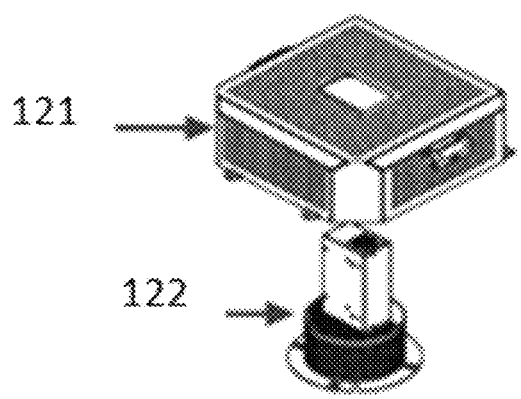
FIG. 2 shows partly a three-dimensional exploded view of the semiconductor fabrication system of FIG. 1 according to an exemplary embodiment of the present inventive concept.
Figure 2:
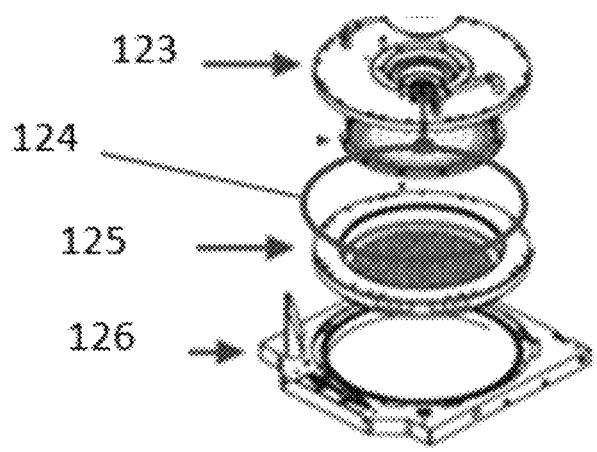
Figure 3:
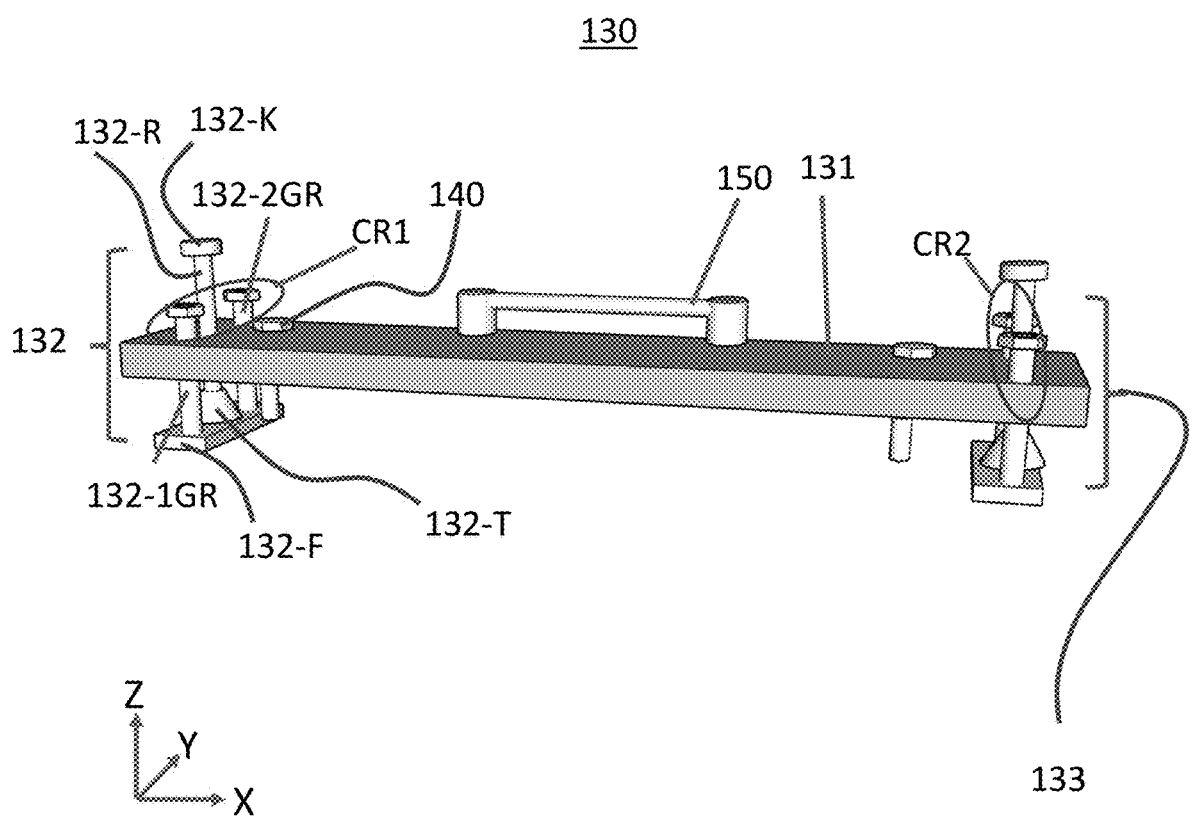
FIG. 3 shows a perspective view of a jacking tool of FIG. 1 according to an exemplary embodiment of the present inventive concept.

With reference to FIGS. 1 and 2, a semiconductor fabrication system attached with a jacking tool will be described according to an exemplary embodiment of the present inventive concept.

FIG. 1 shows a semiconductor fabrication system 100 with a jacking tool 200 attached thereto according to an exemplary embodiment of the present inventive concept. FIG. 2 shows partly a three-dimensional exploded view of the semiconductor fabrication system 100 of FIG. 1 according to an exemplary embodiment of the present inventive concept. Hereinafter, for the convenience of description, it is assumed that the semiconductor fabrication system 100 may perform a preclean process on a wafer. The present inventive concept, however, is not limited thereto. For example, the semiconductor fabrication system 100 may include a fabrication apparatus for a deposition process or an etch process.

The semiconductor fabrication system 100 includes a frame 110, a chamber (not shown here) and a chamber lid 120. The frame 110 may accommodate the chamber. The frame 110 may be formed of stainless steel to support the chamber and the chamber lid 120.

The chamber lid 120 may be detachably disposed on the chamber. The chamber lid 120 includes a lid cover 121, a radio-frequency (RF) generator 122, a top plate 123, an O-ring 124, a showerhead 125 and a lid plate 126. The lid cover 121 (not shown in FIG. 1) covers the RF generator 122 that provides a gas in the chamber with energy enough to generate plasma in the chamber. The RF generator 122 is accommodated in the top plate 123. The top plate 123 is combined with the showerhead 125 that serves to distribute evenly a gas provided from the external into the chamber. For example, the showerhead 125 may include a plurality of holes (not shown here) evenly arranged in the showerhead 125, and the gas may delivered into the chamber through the holes. The O-ring 124 is interposed between the top plate 123 and the showerhead 125 to maintain vacuum in the chamber when the semiconductor fabrication system 100 is in operation. To maintain vacuum in the chamber, the top plate 123 and the showerhead 125 may provide a sealing surface with the O-ring 124 and may thus be airtightly coupled with to each other. If there are gouges present on the sealing surface, the semiconductor fabrication system 100 may be difficult to reach a vacuum state as desired for a fabrication process or may lose vacuum of the chamber in operation due to a leak path along the gouges.

Such gouges on the sealing surface may be accidentally made in the maintenance of the semiconductor fabrication system 100. For example, in the maintenance thereof, the top plate 123 and the showerhead 125 may be separated from each other. In doing so, a maintenance engineer may apply an external force to the top plate 123 and the showerhead 125 using a screw driver and/or a pryer. The external force need to be one greater than a static cohesion of the O-ring 124 to the top plate 123 and the showerhead 125. The mechanical contact between the screw driver and/or the pryer with the sealing surface may generate accidentally the gouges on the sealing surface of the showerhead 125 and/or the top plate 123.

According to an exemplary embodiment, the separation of the top plate 123 and the showerhead 125 may be made in a non-destructive manner or without a mechanical contact to the sealing surface, and thus the gouges of the sealing surface may be prevented in the maintenance.

The semiconductor fabrication system 100 further includes a jacking tool 130 attached to the chamber lid 120. During maintenance, after the lid cover 121 and the RF generator 122 are removed from the semiconductor fabrication system 100, the jacking tool 130 is attached to the chamber lid 120 and is placed on the frame 110. More detailed description of such attachment will be described with reference to FIGS. 3 to 6.

Hereinafter, the jacking tool 130 will be described with reference to FIGS. 3 to 6 according to an exemplary embodiment of the present inventive concept.

The jacking tool 130 includes a bar 131, a first jack 132 and a second jack 133.

The first jack 132 may be movably attached the bar 131. The second jack 133 may be movably attached to the bar 131. The first jack 132 and the second jack 133 are arranged along a first direction X. In an exemplary embodiment, the first jack 132 and the second jack 133 may be substantially the same in structure and material.

The first jack 132 includes a foot 132-F, a first guiding rod 132-1GR, a second guiding rod 132-2GR, a rod 132-R, a toggle 132-T and a knob 132-K. In an exemplary embodiment, the foot 132-F may include aluminum.

The first jack 132 further includes a Teflon (Polytetrafluoroethylene) pad TP on a bottom of the foot 132-F. The Teflon (Polytetrafluoroethylene) pad TP may be attached to the bottom of the foot 132-F using an adhesive. The present inventive concept is not limited thereto. For example, the Teflon (Polytetrafluoroethylene) pad TP may be inserted between the bottom of the foot 132-F and the frame 110 when the jacking tool 130 is installed on the frame 110. The Teflon (Polytetrafluoroethylene) pad TP may serve to protect the frame 110 from the foot. Without the Teflon (Polytetrafluoroethylene) pad TP, the foot 132-F, when applying a downward force on the frame 110, may cause scratch or dent on the frame 110.

The first guiding rod 132-1GR has one end attached to the foot 132-F and penetrates the bar 131 in a third direction Z.

The second guiding rod 132-2GR has one end attached to the foot 132-F and penetrates the bar 131 in the third direction Z. The second guiding rod 132-2GR is spaced apart from the first guiding rod 132-1GR in a second direction Y. The first direction X and the second direction Y cross each other on the same plane which may be in parallel to a top surface of the frame 110, for example. The third direction Z may be perpendicular to the plane on which the first direction X and the second direction Y cross each other.

The rod 132-R is disposed between the first guiding rod 132-1GR and the second guiding rod 132-2GR. For example, the rod 132-R, the first guiding rod 132-1GR and the second guiding rod 132-2GR are aligned in the second direction Y. The rod 132-R is threaded so that the rod 132-R is movably attached to the bar 131. The present inventive concept is not limited thereto. The rod 132-R may include partly a threaded section through which the rod 132-R may be movably attached to the bar 131.

The knob 132-K is attached to one end of the rod 132-R that is distal to the foot 132-F in the third direction Z. Through the knob 132-K, an external rotational force may be applied to the rod 132-R.

The toggle 132-T is attached to an opposite end of the rod 132-R that is proximate to the foot 132-F in the third direction Z. The toggle 132-T is disposed between the bar 131 and the foot 132-F. The pad toggle 132-T may serve to deliver the external rotational force to the foot 132-F as a downward force. For example, turning of the knob 132-K causes the toggle 132-T to move toward the foot 132-F, and after the toggle 132-T lands on, or is in contact with, the foot 132-F of the first jack 132, further turning of the knob 132-K may cause the threaded rod 132-R to continue to turn so that a downward force continues to be applied to the foot 132-F. It will be described later that this downward force creates a reaction force sufficient to separate the top plate 123 from the showerhead 125 that are coupled to each other by a static cohesion of the O-ring 124.

The jacking tool 130 further includes a handle 150 attached to the bar 131. The handle 150 may be used to lift the top plate 123 from the showerhead 125 once they are separated from each other by using the jacking tool 130 in the maintenance according to the present inventive concept.

Figure 4:
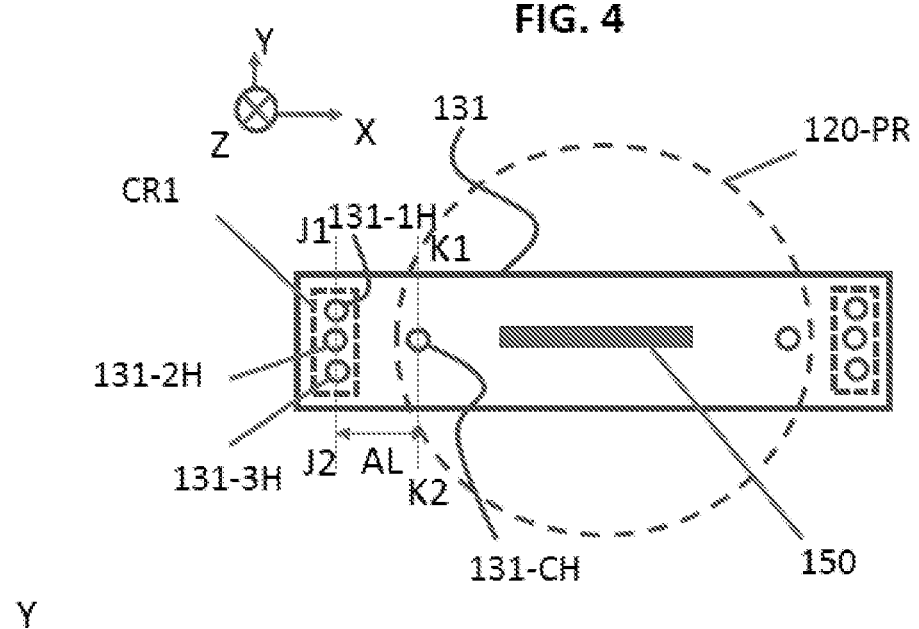
FIG. 4 shows a top view of a bar of the jacking tool of FIG. 3 according to an exemplary embodiment of the present inventive concept.
Figure 5:
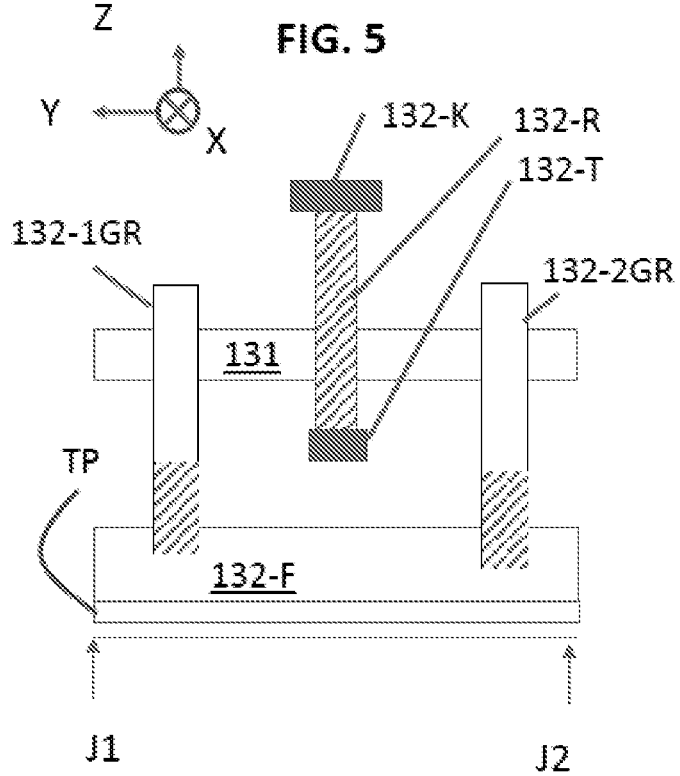
FIG. 5 shows a cross-sectional view, taken along line J1-J2 of FIG. 1, of a jacking tool according to an exemplary embodiment of the present inventive concept.
Figure 6:
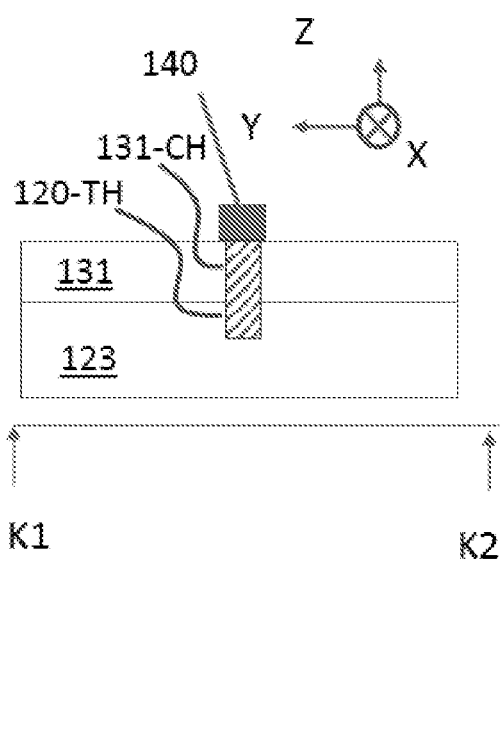
FIG. 6 shows a cross-sectional view, taken along line K1-K2 of FIG. 1, of a jacking tool according to an exemplary embodiment of the present inventive concept.

The bar 131, as shown in FIG. 4, is of rectangular shape and extends in the first direction X. The bar 131 has a first connection region CR1 proximate to one end of the bar 131 and a second connection region CR2 proximate to another end of the bar 131. The bar 131 has a length greater than a diameter of the top plate 123 so that the first connection region CR1 and the second connection region CR2 of the bar 131 are disposed over the frame 110.

The first connection region CR1 is non-overlapped with a perimeter 120-PR of the chamber lid 120. The inside of the perimeter 120-PR is a footprint where the chamber lid 120 is positioned with respect to the bar 131. For example, the first connection region CR1 is positioned the outside of the perimeter 120-PR. The description of the first connection region CR1 applies to the second connection region CR2.

The first connection region CR1 of the bar 131 includes a first hole 131-1H, a second hole 131-2H and a third hole 131-3H arranged in the second direction Y. In an exemplary embodiment, the second hole 131-2H may be positioned in the center between the first hole 131-1H and the third hole 131-3H. The second hole 131-2H may have a threaded, inner surface, and the first hole 131-1H and the third hole 131-3H may have an inner surface without threads thereon.

In this case, the first guiding rod 132-GR1 penetrates the first hole 131-1H and is slidingly attached to the first hole 131-1H. The phrase "slidingly attached" means that two objects are attached to each other such that one of them moves freely against the other in a direction that an external force is applied. The second guiding rod 132-2GR penetrates the third hole 131-3H. The threaded section of the rod 132-R is connected to the threaded, inner surface so that a rotational movement of the rod 132-R is converted to a downward movement or an upward movement along the third direction Z depending on the direction of the rotational movement. For example, clockwise rotational movement of the rod 132-R generates a downward movement of the rod 132-R through the threaded connection between the rod 132-R and the second hole 131-2H; and counter-clockwise rotational movement of the rod 132-R generates an upward movement of the rod 132-R through the threaded connection between the rod 132-R and the second hole 131-2H.

The bar 131 further includes a connection hole 131-CH spaced apart from the second hole 131-2H of the first connection region CR1 in the first direction X. A threaded connection rod 140 may be inserted into the connection hole 131-CH and a threaded hole 120-TH of the chamber lid 120. The threaded hole 120-TH of the chamber lid 120 may be formed in the top plate 123. For example, the threaded hole 120-TH of the chamber lid 120 may penetrate partially the top plate 123. With the threaded connection rod 140, the jacking tool 130 and the top plate 123 are attached to each other.

Figure 7:
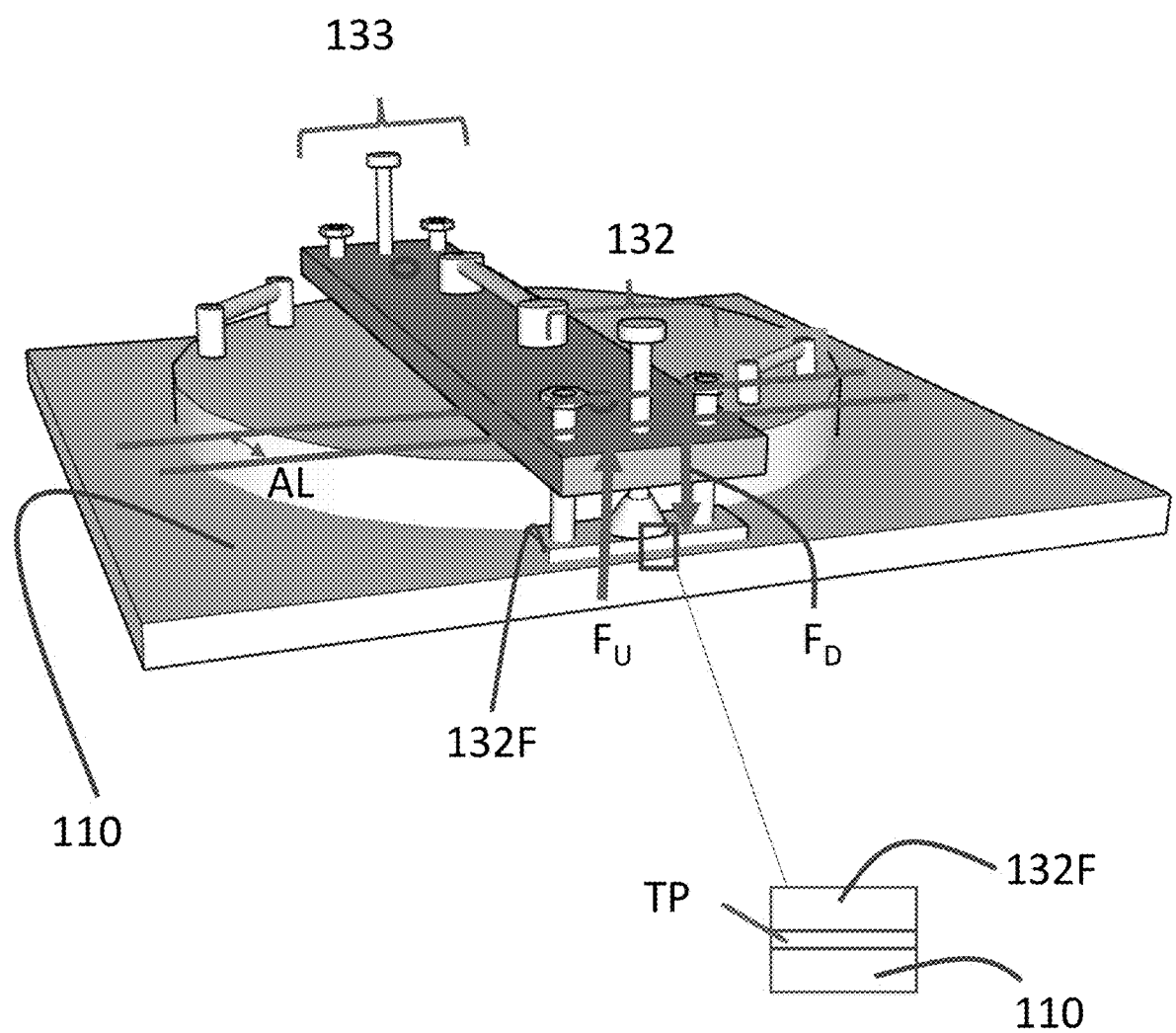
FIG. 7 shows a force that is applied through a jacking tool to a top plate of the semiconductor fabrication system of FIG. 1 according to an exemplary embodiment of the present inventive concept.

Hereinafter, the operation of the jacking tool 130 will be described with reference to FIG. 7. FIG. 7 shows a force $F_T$ applied through the first jack 132 and the second jack 133 to the top plate 123 of the chamber lid 120 according to an exemplary embodiment of the present inventive concept. The operation of the first jack 132 is substantially the same as that of the second jack 133. For the convenience of description, the operation of the jacking tool 130 will be made with reference to the first jacking 132. The same description applies to the operation of the second jack 133.

By applying torque to rotate the knob 132-K in a clockwise, for example, the rod 132R moves down toward the foot 132-F until the toggle 132-T lands on the foot 132-F. To apply a downward force $F_D$ to the frame 110, the knob 132-K is continuously turned so that the downward force $F_D$ is applied to the frame 110 through the foot 132-F, and in turn generates as a reaction force $F_T$ applied to the top plate 123.

The first jack 132 may apply to the top plate 123 the force $F_T$ sufficient to overcome the static cohesion of the O-ring 124 to the top plate 123 and the showerhead 125. The second jacking 133 may operate in the same manner as that of the first jacking 132.

The Teflon (Polytetrafluoroethylene) pad TP is disposed between the bottom of the foot 132-F and the frame 110. The Teflon (Polytetrafluoroethylene) pad TP may serve to protect the frame 110 from the foot 132-F. Without the Teflon (Polytetrafluoroethylene) pad TP, the foot 132-F when applying a downward force on the frame 110 may cause scratch or dent on the frame 110.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A jacking tool, comprising:
    a bar extending in a first direction and having a first connection region proximate to one end of the bar and a second connection region proximate to another end of the bar;
    a first jack movably attached to the first connection region of the bar; and
    a second jack movably attached to the second connection region of the bar,
    wherein the first jack includes:
        a foot;
        a first guiding rod and a second guiding rod spaced apart from each other in a second direction crossing the first direction, the first guiding rod having one end attached to the foot and penetrating the bar in a third direction and the second guiding rod having one end attached to the foot and penetrating the bar in the third direction;
        a rod disposed between the first guiding rod and the second guiding rod, the rod having a thread section that is movably attached to the bar;
        a knob attached to one end of the rod distal to the foot in the third direction; and
        a toggle attached to an opposite end of the rod that is proximate to the foot in the third direction, wherein the toggle is disposed between the bar and the foot;
    wherein a threaded connection rod extends from a threaded connection hole on the bar to attach to an object to be lifted.

2. The jacking tool of claim 1,
    wherein the first guiding rod is slidingly attached to the bar so that a downward force in the third direction applied to the foot through the toggle causes the bar to move away from the foot in the third direction.

3. The jacking tool of claim 1,
wherein the first connection region of the bar includes a first hole, a second hole and a third hole arranged in the second direction,
and wherein the second hole is threaded.

4. The jacking tool of claim 3,
wherein the first guiding rod penetrates the first hole,
wherein the second guiding rod penetrates the third hole, and
wherein the threaded section of the rod is connected to the second hole.

5. The jacking tool of claim 3,
wherein the second connection region of the bar has the same configuration of the first connection region.

6. The jacking tool of claim 3,
wherein the bar further includes the threaded connection hole spaced apart from the second hole of the first connection region in the second direction, and
wherein the threaded connection rod is configured to attach the jacking tool to an object to be lifted through the threaded connection hole.

7. The jacking tool of claim 1,
wherein the foot includes aluminum.

8. The jacking tool of claim 1,
wherein the bar is of rectangular shape.

9. The jacking tool of claim 1, further comprising:
a Polytetrafluoroethylene pad attached to a bottom of the foot.

10. A semiconductor fabrication system having a jacking tool, comprising:
a frame;
a showerhead accommodated with the frame and configured to distribute a gas into a chamber;
a top plate disposed on the showerhead;
an O-ring interposed between the showerhead and the top plate; and
a jacking tool attached to the top plate,
wherein the jacking tool includes:
a bar extending in a first direction and having a first connection region proximate to one end of the bar and a second connection region proximate to another end of the bar, the bar being attached to the top plate;
a first jack movably attached to the first connection region of the bar and being in contact with the frame; and
a second jack movably attached to the second connection region of the bar and being in contact with the frame;
wherein the first jack includes:
a foot;
a first guiding rod and a second guiding rod spaced apart from each other in a second direction crossing the first direction, the first guiding rod having one end attached to the foot and penetrating the bar in a third direction and the second guiding rod having one end attached to the foot and penetrating the bar in the third direction;
a rod disposed between the first guiding rod and the second guiding rod, the rod having a thread section that is movably attached to the bar;
a knob attached to one end of the rod distal to the foot in the third direction; and
a toggle attached to an opposite end of the rod that is proximate to the foot in the third direction, wherein the toggle is disposed between the bar and the foot;
wherein a threaded connection rod extends from a threaded connection hole on the bar to attach to an object to be lifted; and
wherein a threaded connection rod extends from a threaded connection hole on the bar to attach to an object to be lifted.

11. The semiconductor fabrication system of claim 10,
wherein the bar is of rectangular shape.

12. The semiconductor fabrication system of claim 11,
wherein a length of the bar is greater than a diameter of the top plate so that the first connection region and the second connection region of the bar are disposed over the frame.

13. The semiconductor fabrication system of claim 10,
wherein the first guiding rod is slidingly attached to the bar so that a downward force applied in the third direction through the toggle exerts a reaction force on the top plate to cause the bar to move away from the foot in the third direction.

14. The semiconductor fabrication system of claim 10,
wherein the first connection region of the bar includes a first hole, a second hole and a third hole arranged in the second direction,
and wherein the second hole is threaded.

15. The semiconductor fabrication system of claim 14,
wherein the first guiding rod penetrates the first hole,
wherein the second guiding rod penetrate the third hole,
wherein the threaded section of the rod is movably coupled to the second hole.

16. The semiconductor fabrication system of claim 14,
wherein the bar further includes the threaded connection hole is spaced apart from the second hole of the first connection region in the second direction, and
wherein the threaded connection rod is configured to attach the jacking tool to the top plate through the threaded connection hole.

17. The semiconductor fabrication system of claim 10, further comprising:
a Polytetrafluoroethylene pad interposed between the foot and the frame.

* * * * *